United States Patent [19]

Minato et al.

[11] Patent Number: 5,435,880
[45] Date of Patent: Jul. 25, 1995

[54] PLASMA PROCESSING APPARATUS

[75] Inventors: Mitsuaki Minato; Atsushi Matsushita; Shinichi Omori, all of Kanagawa; Jun Kanamori, Tokyo, all of Japan

[73] Assignees: Tokyo Ohka Kogyo Co., Ltd., Kanagawa; Oki Electric Industry Co., Ltd., Tokyo, both of Japan

[21] Appl. No.: 137,292

[22] Filed: Oct. 14, 1993

[30] Foreign Application Priority Data

Oct. 14, 1992 [JP] Japan .................. 4-301819

[51] Int. Cl.6 .............................. C23F 1/02
[52] U.S. Cl. .................. 156/345; 118/723 I; 118/723 R
[58] Field of Search ............ 118/723 I, 723 R; 156/345, 643; 204/298.34, 298.06, 298.08, 192.32

[56] References Cited

U.S. PATENT DOCUMENTS 4,786,352 11/1988 Benzing ..................... 156/345
5,254,214 10/1993 Hijikata ..................... 156/643

*Primary Examiner*—R. Bruce Breneman
*Assistant Examiner*—Joni Y. Chang
*Attorney, Agent, or Firm*—Weiner, Carrier & Burt; Joseph P. Carrier; Irving M. Weiner

[57] ABSTRACT

A plasma processing apparatus for processing a workpiece such as a semiconductor wafer in a plasma includes a downstream- or coaxial-type chamber for housing the workpiece. A first sheet-like electrode is mounted on an outer circumferential surface of the chamber and electrically connected to a high-frequency power supply, and a second sheet-like electrode is mounted on the outer circumferential surface of the chamber and connected to ground. The first and second sheet-like electrodes are spaced in confronting relationship from each other circumferentially of the chamber across or along the axis thereof. The first and second sheet-like electrodes have respective axial or circumferential arrays of successive teeth, such as rectangular comb teeth, extending circumferentially or axially of the chamber and respective axial or circumferential arrays of successive recesses which complementarily receive the teeth, respectively, in an interdigitating pattern. The teeth have respective edges spaced from the corresponding edges of the recesses by a substantially uniform gap.

22 Claims, 5 Drawing Sheets

FIG. 6 *(Prior Art)*
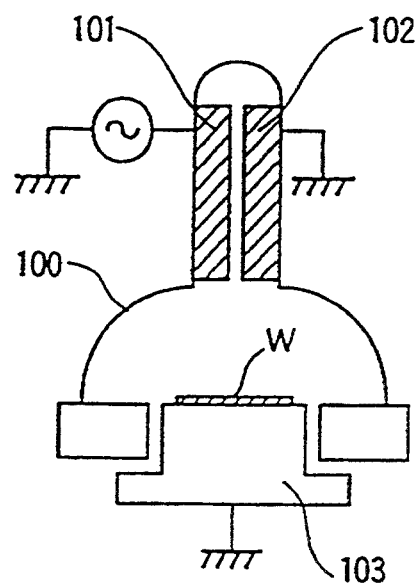
FIG. 7 *(Prior Art)*
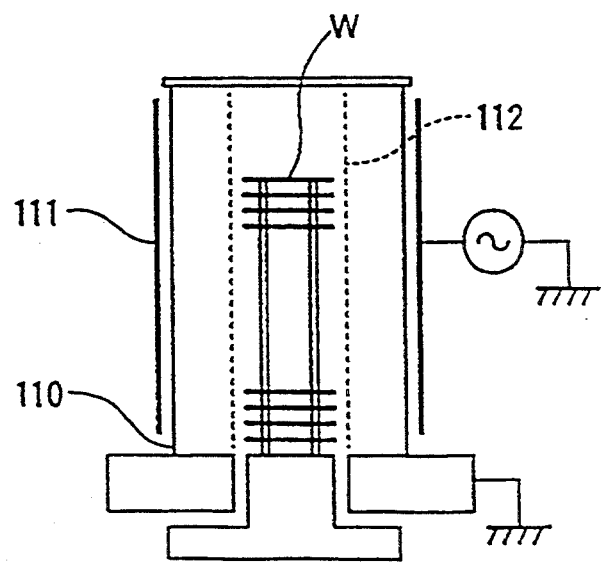

PLASMA PROCESSING APPARATUS

BACKGROUND OF THE INVENTION

1. Field of the Invention

The present invention relates to a plasma processing apparatus for processing, e.g., etching or ashing, a coating on a workpiece such as a semiconductor wafer in a plasma.

2. Description of the Relevant Art

FIGS. 6 and 7 of the accompanying drawings show conventional plasma processing apparatus for etching or ashing a coating on a semiconductor wafer in a plasma while minimizing the risk of damaging the semiconductor wafer.

The plasma processing apparatus shown in FIG. 6, which is known as a downstream-type plasma processing apparatus, has a bell-Jar-shaped chamber 100 including an upper smaller-diameter portion on which there is disposed a pair of sheet-like electrodes 101, 102 in confronting relationship to each other. One of the sheet-like electrodes 101, 102 is electrically connected to a high-frequency power supply whereas the other electrode is connected to ground. The plasma processing apparatus also includes a table 103 for placing a semiconductor wafer W thereon, the table 103 being positioned in the lower end of the chamber 100 downwardly of the sheet-like electrodes 101, 102. Since the table 103 is downwardly spaced from a plasma-generating region between the sheet-like electrodes 101, 102, the semiconductor wafer W can be processed mainly with radicals without being affected by charged particles. A plasma is generated mainly in a region where the spacing between the sheet-like electrodes 101, 102 is minimum, and hence is not uniformly produced in all the space between the sheet-like electrodes 101, 102. Therefore, no stable plasma is generated between the sheet-like electrodes 101, 102, resulting in a relatively low etching or ashing rate. The etching or ashing rate may be increased by increasing the high-frequency energy applied by the high-frequency power supply or increasing the degree of a vacuum created in the chamber 100. However, the increased high-frequency energy or degree of a vacuum tends to draw the plasma toward the table 103 or an evacuating port. As a result, the generated plasma is positioned closely to the semiconductor wafer W, with result that the semiconductor wafer W may be charged by charged particles or the density of the plasma becomes irregular over the semiconductor wafer W, adversely affecting the semiconductor wafer W. Adjustments to avoid such a drawback are difficult to make as the above phenomenon differs from apparatus to apparatus.

Another conventional plasma processing apparatus that is similar to the plasma processing apparatus shown in FIG. 6 includes sheet-like electrodes disposed around a tubular chamber and electrically connected to a high-frequency power supply, and a table connected to ground for placing a semiconductor wafer thereon. With this arrangement, since a plasma is generated in a space between the sheet-like electrodes and the table, the generated plasma is liable to impinge directly on the semiconductor wafer on the table, causing damage to the semiconductor wafer.

The plasma processing apparatus shown in FIG. 7 is referred to as a coaxial-type plasma processing apparatus. The plasma processing apparatus includes a tubular chamber 110 surrounded by a tubular sheet-like electrode 111 electrically connected to a high-frequency electrode. A grounded tubular inner electrode 112 in the form of a metal mesh or a punched metal sheet is housed in the tubular chamber 110. A plasma is generated in a space between the sheet-like electrode 111 and the inner electrode 112, with semiconductor wafers W being located radially inwardly of the inner electrode 112. The inner electrode 112 prevents charged particles from the plasma from entering the region where the semiconductor wafers W are located. However, the inner electrode 112 acting as an electrode is incapable of completely blocking charged particles because the plasma is produced very closely to the inner electrode 112. If the high-frequency energy supplied from the high-frequency power supply is increased for an increased etching or ashing rate, then the temperature of the inner electrode 112 is increased. The increased temperature of the inner electrode 112 poses various problems. For example, when a resist with a high dose of ions is to be peeled off a semiconductor wafer, the temperature in the chamber 110 is increased causing a burst before a hard surface layer is peeled off the semiconductor wafer. The increased temperature of the inner electrode 112 results in an increased etching or ashing rate only in a region near the inner electrode 112, failing to process the semiconductor wafer uniformly.

SUMMARY OF THE INVENTION

It is an object of the present invention to provide a plasma processing apparatus capable of processing a workpiece in a stable and uniform plasma without causing damage to the workpiece.

According to the present invention, there is provided a plasma processing apparatus comprising a chamber for housing a workpiece to be processed, the chamber having an axis and an outer circumferential surface, a first sheet-like electrode mounted on the outer circumferential surface of the chamber and electrically connected to a high-frequency power supply, and a second sheet-like electrode mounted on the outer circumferential surface of the chamber and connected to ground, the first and second sheet-like electrodes being spaced in confronting relationship from each other circumferentially of the chamber across the axis thereof, the first and second sheet-like electrodes having respective axial arrays of successive teeth extending circumferentially of the chamber and respective axial arrays of successive recesses which complementarily receive the teeth, respectively, in an interdigitating pattern, the teeth having respective edges spaced from the corresponding edges of the recesses by a substantially uniform gap.

According to the present invention, there is also provided a plasma processing apparatus comprising a chamber for housing a workpiece to be processed, said chamber having an axis and an outer circumferential surface, a first sheet-like electrode mounted on said outer circumferential surface of the chamber and electrically connected to a high-frequency power supply, and a second sheet-like electrode mounted on the outer circumferential surface of said chamber and connected to ground, said first and second sheet-like electrodes being spaced in confronting relationship from each other axially of said chamber along said axis thereof, said first and second sheet-like electrodes having respective circumferential arrays of successive teeth extending axially of said chamber and respective circumferential arrays of successive recesses which complementarily receive said teeth, respectively, in an interdigitating pattern, said teeth having respective edges spaced from the corresponding edges of the recesses by a substantially uniform gap.

The above and further objects, details and advantages of the present invention will become apparent from the following detailed description of preferred embodiments thereof, when read in conjunction with the accompanying drawings.

BRIEF DESCRIPTION OF THE DRAWINGS

FIG. 6 is a front elevational view of a conventional downstream-type plasma processing apparatus; and FIG. 7 is a front elevational view of a conventional coaxial-type plasma processing apparatus.

DETAILED DESCRIPTION OF THE PREFERRED EMBODIMENTS

Figure 1:
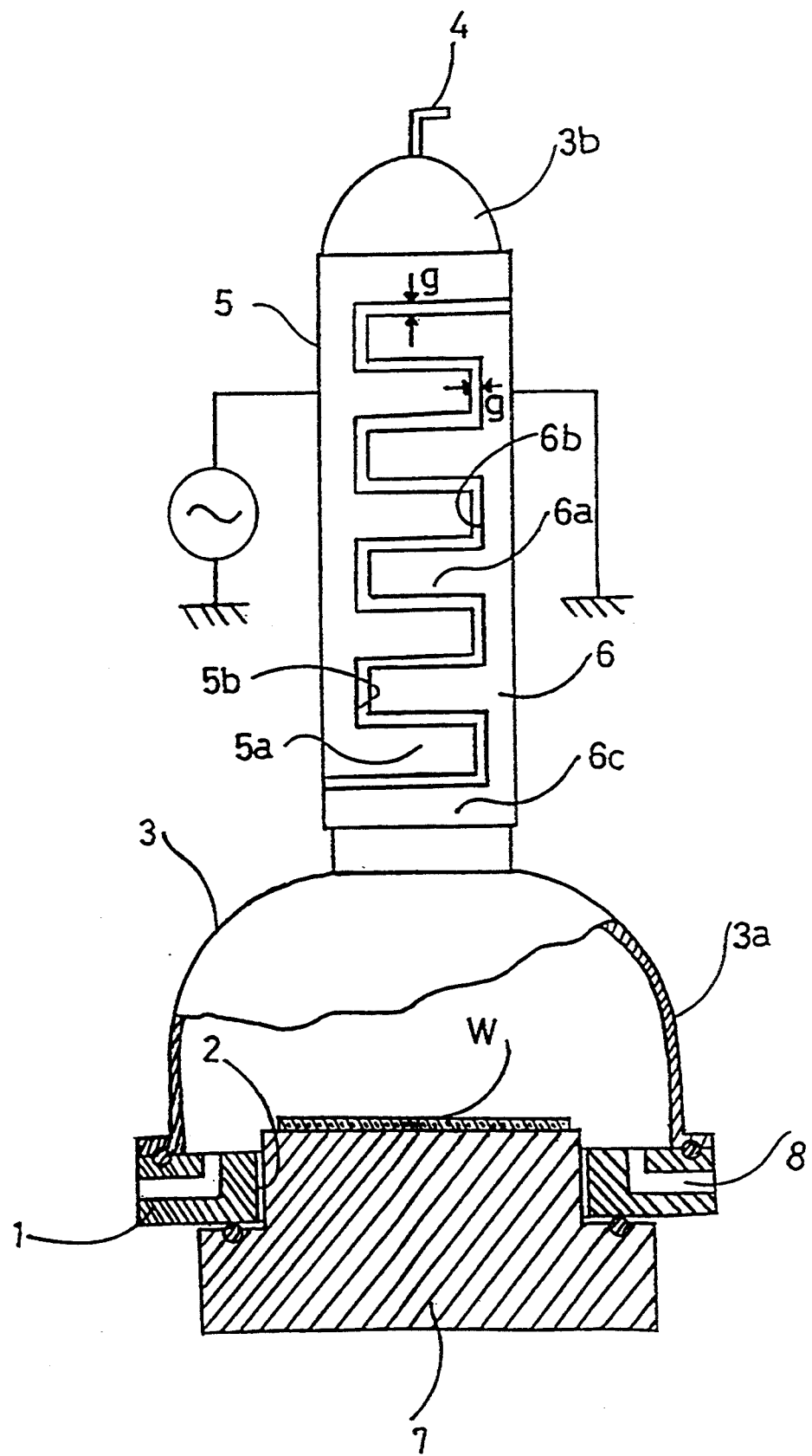
FIG. 1 is a front elevational view, partly in cross section, of a plasma processing apparatus according to a first embodiment of the present invention.

As shown in FIG. 1, a plasma processing apparatus, which is of the downstream type, according to a first embodiment of the present invention includes a base 1 having an opening 2 defined therein and a downstream-type chamber 3 of synthetic quartz mounted on the base 1 in covering relationship to the opening 2.

The chamber 3 comprises a dome-shaped lower portion 3a for placing a semiconductor wafer W therein and a smaller-diameter tubular upper portion 3b joined to and extending upwardly from an upper central end of the dome-shaped lower portion 3a. The tubular upper portion 3b has a reactive gas inlet 4 on its upper end. The plasma processing apparatus also has a first sheet-like electrode 5 and a second sheet-like electrode 6 which are mounted on an outer circumferential surface of the tubular upper portion 3b and spaced in confronting relationship from each other across the axis of the chamber 3. The first sheet-like electrode 5 is electrically connected to a high-frequency power supply and the second sheet-like electrode 6 is connected to ground.

The first and second sheet-like electrodes 5, 6 have respective vertical or axial arrays of successive rectangular comb teeth 5a, 6a extending circumferentially of the tubular upper portion 3b and respective vertical or axial arrays of successive rectangular recesses 5b, 6b which complementarily receive the comb teeth 6a, 5a, respectively, in an interdigitating pattern. The edges of the comb teeth 5a, 6a are spaced from the corresponding edges of the recesses 6b, 5b by a gap or clearance g which is substantially uniform or the same in the axial and circumferential directions of the tubular upper portion 3b as shown in the drawings. The interdigitating pattern of the first and second sheet-like electrodes 5, 6 with the axially and circumferentially uniform gap g between the edges of the comb teeth 5a, 6a and the recesses 6b, 5b allows a plasma to be generated uniformly centrally in the tubular upper portion 3b.

The second sheet-like electrode 6 has a lower end 6c surrounding the tubular lower portion 3b below the first sheet-like electrode 5. Since the second sheet-like electrode 6 that is grounded surrounds the lowermost end of a space in which a plasma is generated, charged particles are prevented from flowing from the plasma toward the semiconductor wafer W placed in the dome-shaped lower portion 3a of the chamber 3.

A table 7 for supporting the semiconductor wafer W is fitted in the opening 2 in the base 1. The base 1 has an exhaust passage 8 defined therein which is connected to a vacuum pump (not shown).

In operation, the chamber 3 is evacuated by the vacuum pump, and a reactive gas is introduced into the chamber 3 from the reactive gas inlet 4. Then, a high-frequency energy is applied from the high-frequency power supply to the first sheet-like electrode 5 for thereby generating a plasma uniformly centrally in the tubular upper portion 3b of the chamber 3 at the gap g between the edges of the comb teeth 5a, 6a and the recesses 5b, 6b of the first and second sheet-like electrodes 5, 6.

Figure 2:
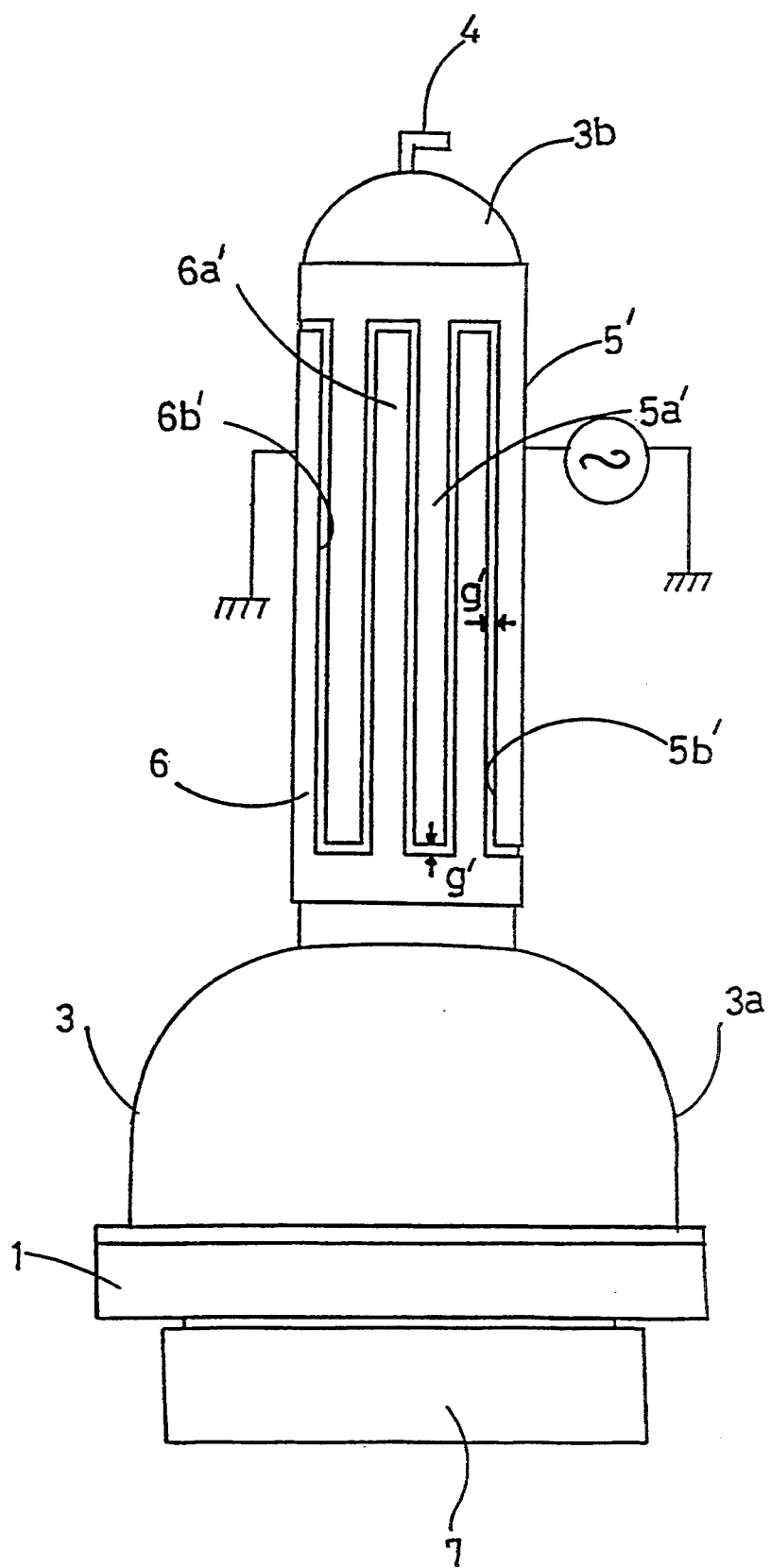
FIG. 2 is a front elevational view of a plasma processing apparatus according to a second embodiment of the present invention.

FIG. 2 shows a plasma processing apparatus according to a second embodiment of the present invention. Those parts shown in FIG. 2 which are identical to those shown in FIG. 1 are denoted by identical reference characters, and will not be described in detail below. The plasma processing apparatus shown in FIG. 2 differs from the plasma processing apparatus shown in FIG. 1 in that first and second sheet-like electrodes 5', 6' are spaced in confronting relationship from each other along the axis of the chamber 3, and have respective circumferential arrays of successive rectangular comb teeth 5a', 6a' extending axially of the tubular upper portion 3b and respective circumferential arrays of successive rectangular recesses 5b', 6b' which complementarily receive the comb teeth 6a', 5a', respectively, in an interdigitating pattern. The edges of the comb teeth 5a', 6a' are spaced from the corresponding edges of the recesses 6b', 5b' by a gap or clearance g' which is substantially uniform in the axial and circumferential directions of the tubular upper portion 3b.

The plasma processing apparatus shown in FIG. 2 generates a plasma uniformly over the inner circumferential surface of the tubular upper portion 3b of the chamber 3 along the gap g' between the edges of the comb teeth 5a', 6a' and the recesses 5b', 6b' of the first and second sheet-like electrodes 5', 6'.

Figure 3:
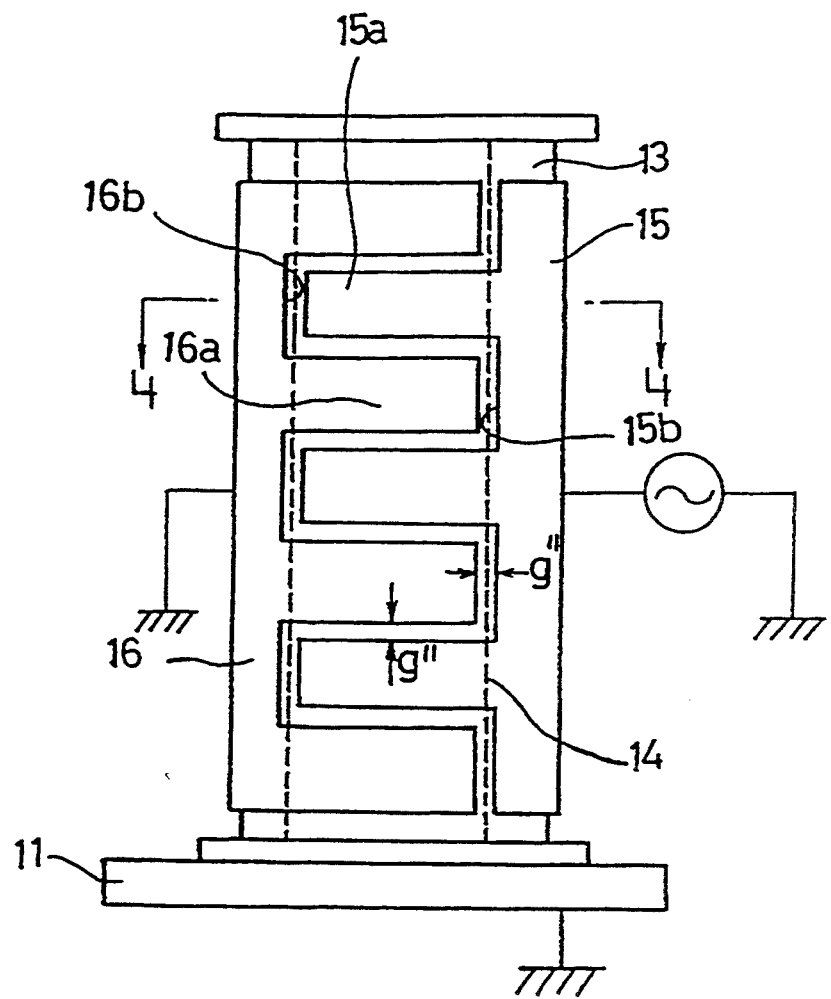
FIG. 3 is a front elevational view of a plasma processing apparatus according to a third embodiment of the present invention.
Figure 4:
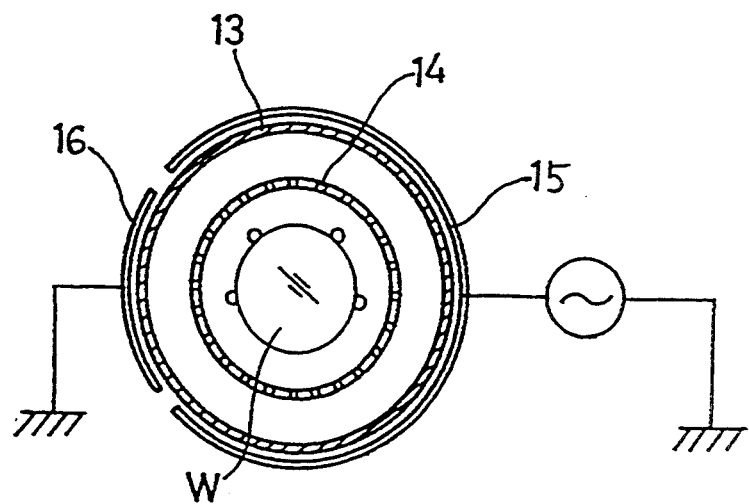
FIG. 4 is a cross-sectional view taken along line 44 of FIG. 3.

FIGS. 3 and 4 illustrate a plasma processing apparatus according to a third embodiment of the present invention. As shown in FIGS. 3 and 4, the plasma processing apparatus, which is of the coaxial type, includes a base 11 and a coaxial-type tubular chamber 13 fixedly mounted on the base 11. The tubular chamber 13 houses therein a tubular conductive electrode 14 in the form of a metal mesh or a punched metal sheet. A semiconductor wafer W to be processed is placed in a space surrounded by the tubular conductive electrode 14.

The plasma processing apparatus further includes a first sheet-like electrode 16 and a second sheet-like electrode 15 which are mounted on an outer circumferential surface of the tubular chamber 13 and spaced in confronting relationship from each other across the axis of the tubular chamber 13. The first sheet-like electrode 16 is connected to ground and the second sheet-like electrode 15 is electrically connected to a high-frequency power supply. As shown in FIG. 4, the electrodes 15, 16 as mounted on the chamber 13 are slightly spaced from the outer circumferential surface of the chamber.

The first and second sheet-like electrodes 16, 15 have respective vertical or axial arrays of successive rectangular comb teeth 16a, 15a extending circumferentially of the tubular chamber 13 and respective vertical or axial arrays of successive rectangular recesses 16b, 15b which complementarily receive the comb teeth 15a, 16a, respectively, in an interdigitating pattern. The edges of the comb teeth 15a, 16a are spaced from the corresponding edges of the recesses 16b, 15b by a gap or clearance g" which is substantially uniform in the axial and circumferential directions of the tubular chamber 13. The interdigitating pattern of the first and second sheet-like electrodes 16, 15 with the axially and circumferentially uniform gap g" between the edges of the comb teeth 15a, 16a and the recesses 16b, 15b allows a plasma to be generated uniformly over the inner circumferential surface of the tubular chamber 13 along the gap g". The plasma is generated primarily between the first and second sheet-like electrodes 15, 16, with the conductive electrode 14 substantially not operating as an electrode. Therefore, charged particles are produced in a region spaced from the conductive electrode 14, and hence do not enter the space in the conductive electrode 14 wherein the semiconductor wafer W is set.

Figure 5:
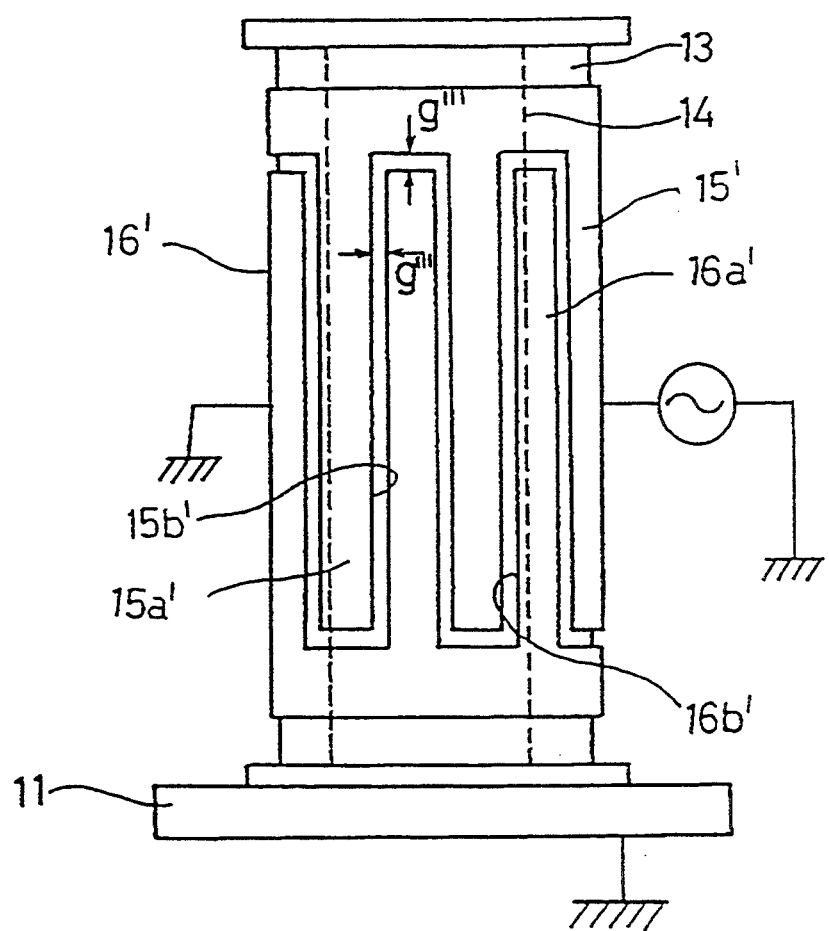
FIG. 5 is a front elevational view of a plasma processing apparatus according to a fourth embodiment of the present invention.

FIG. 5 shows a plasma processing apparatus according to a fourth embodiment of the present invention, the forth embodiment being of the coaxial type, like the third embodiment of FIGS 3–4. Those parts shown in FIG. 5 which are identical to those shown in FIGS. 3 and 4 are denoted by identical reference characters, and will not be described in detail below. The plasma processing apparatus shown in FIG. 5 differs from the plasma processing apparatus shown in FIGS. 3 and 4 in that first and second sheet-like electrodes 16', 15' have respective circumferential arrays of successive rectangular comb teeth 16a', 15a' extending axially of the tubular chamber 13 and respective circumferential arrays of successive rectangular recesses 16b', 15b' which complementarily receive the comb teeth 16a', 15a', respectively, in an interdigitating pattern. The edges of the comb teeth 16a', 15a' are spaced from the corresponding edges of the recesses 16b', 15b' by a gap or clearance g''' which is substantially uniform in the axial and circumferential directions of the tubular chamber 13.

The plasma processing apparatus shown in FIG. 5 generates a plasma uniformly over the inner circumferential surface of the tubular chamber 13 along the gap g''' between the edges of the comb teeth 16a', 15a' and the recesses 16b', 15b' of the first and second sheet-like electrodes 16', 15'. Also in this forth embodiment the first, grounded sheet-like electrode 16' includes a lower end 16c' which circumferentially surrounds the tubular chamber 13 below the second sheet-like electrodes 15', similar to the first and second embodiments.

The downstream-type plasma processing apparatus according to the invention are more advantageous than the coaxial-type plasma processing apparatus according to the invention in that charged particles are confined more effectively because no workpiece or semiconductor wafer is present in the region of the chamber, the upper tubular portion, where the plasma is generated.

Each of the plasma processing apparatus according to the present invention can generate a stable plasma without the produced electric field being disturbed even when a high-frequency energy of 2 kW or more is applied between the first and second electrodes. In the conventional plasma processing apparatus, the produced electric field was disturbed when a high-frequency energy of 1.4 kW or more was applied.

Therefore, the etching or ashing rate can greatly be increased without causing damage to the semiconductor wafer while allowing a plasma to be generated uniformly.

While the electrodes in the above illustrated embodiments are shown as having rectangular comb teeth complementarily received in rectangular recesses, they may comprise triangular saw teeth complementarily received in triangular recesses.

Although certain preferred embodiments of the present invention has been shown and described in detail, it should be understood that various changes and modifications may be made therein without departing from the scope of the appended claims.

What is claimed is:

1. A plasma processing apparatus comprising:
   chamber for housing a workpiece to be processed, said chamber having an axis and an outer circumferential surface;
   a first sheet-like electrode mounted on said outer circumferential surface of the chamber and electrically connected to a high-frequency power supply; and
   a second sheet-like electrode mounted on the outer circumferential surface of said chamber and connected to ground;
   said first and second sheet-like electrodes being spaced in confronting relationship from each other circumferentially of said chamber across said axis thereof;
   said first and second sheet-like electrodes having respective axial arrays of successive teeth extending circumferentially of said chamber and respective axial arrays of successive recesses which complementarily receive said teeth, respectively, in an interdigitating pattern, said teeth having respective edges spaced from the corresponding edges of the recesses by a substantially uniform gap; and
   said second sheet-like electrode having a lower end surrounding said chamber below said first sheet-like electrode.

2. A plasma processing apparatus according to claim 1, wherein said teeth comprise rectangular shaped teeth, respectively.

3. A plasma processing apparatus according to claim 1, wherein said gap is substantially uniform in axial and circumferential directions of said chamber.

4. A plasma processing apparatus according to claim 1, wherein said chamber comprises a downstream-type chamber including a portion disposed below said first and second sheet-like electrodes, and said apparatus further comprising a table disposed in said portion of the chamber for supporting the workpiece thereon.

5. A plasma processing apparatus according to claim 1, wherein said chamber comprises a smaller-diameter tubular upper portion and a dome-shaped lower portion joined thereto, said first and second sheet-like electrodes being mounted on said smaller-diameter tubular upper portion.

6. A plasma processing apparatus according to claim 1, wherein said first and second sheet-like electrodes as mounted on said chamber are slightly spaced from said outer circumferential surface of said chamber.

7. A plasma processing apparatus according to claim 1, wherein said chamber comprises a coaxial-type tubular chamber including a tubular conductive member disposed within the outer circumferential surface of said chamber coaxial with said axis, the workpiece being disposed in a space within said tubular conductive member, and said tubular conductive member having a plurality of openings defined in a circumferential surface thereof such that said tubular conductive member prevents charged particles produced in relation to a plasma generated between said first and second sheet-like electrodes from entering said space.

8. A plasma processing apparatus according to claim 7, wherein said tubular conductive member comprises a metal mesh.

9. A plasma processing apparatus according to claim 7, wherein said tubular conductive member comprises a punched metal sheet.

10. A plasma processing apparatus comprising:
a chamber for housing a workpiece to be processed, said chamber having an axis and an outer circumferential surface;
a first sheet-like electrode mounted on said outer circumferential surface of the chamber and electrically connected to a high-frequency power supply; and
a second sheet-like electrode mounted on the outer circumferential surface of said chamber and connected to ground;
said first and second sheet-like electrodes being spaced in confronting relationship from each other axially of said chamber along said axis thereof;
said first and second sheet-like electrodes having respective circumferential arrays of successive teeth extending axially of said chamber and respective circumferential arrays of successive recesses which complementarily receive said teeth, respectively, in an interdigitating pattern, said teeth having respective edges spaced from the corresponding edges of the recesses by a substantially uniform gap; and
said second sheet-like electrode having a lower end surrounding said chamber below said first sheet-like electrode.

11. A plasma processing apparatus according to claim 10, wherein said first and second sheet-like electrodes as mounted on said chamber are slightly spaced from said outer circumferential surface of said chamber.

12. A plasma processing apparatus according to claim 10, wherein said teeth comprise rectangular shaped teeth, respectively.

13. A plasma processing apparatus according to claim 10, wherein said gap is substantially uniform in axial and circumferential directions of said chamber.

14. A plasma processing apparatus according to claim 10, wherein said chamber comprises a downstream-type chamber including a portion disposed below said first and second sheet-like electrodes, and said apparatus further comprising a table disposed in said portion of the chamber for supporting the workpiece thereon.

15. A plasma processing apparatus according to claim 10, wherein said chamber comprises a smaller-diameter tubular upper portion and a dome-shaped lower portion joined thereto, said first and second sheet-like electrodes being mounted on said smaller-diameter tubular upper portion.

16. A plasma processing apparatus according to claim 10, wherein said chamber comprises a coaxial-type tubular chamber including a tubular conductive member disposed within said chamber coaxial with said axis, the workpiece being disposed in a space within said tubular conductive member, and said tubular conductive member having a plurality of openings defined in a circumferential surface thereof such that said tubular conductive member prevents charged particles produced relative to generation of a plasma between the first and second sheet-like electrodes from entering said space.

17. A plasma processing apparatus according to claim 16, wherein said tubular conductive member comprises a metal mesh.

18. A plasma processing apparatus according to claim 16, wherein said tubular conductive member comprises a punched metal sheet.

19. A plasma processing apparatus according to claim 16, wherein said lower end of said second sheet-like electrode surrounds said coaxial-type tubular chamber below said first sheet-like electrode.

20. A plasma processing apparatus comprising:
a chamber for housing a workpiece during a plasma processing operation, said chamber having a vertically extending longitudinal axis and a circumferential outer surface;
electrode means for uniformly generating a plasma within said chamber;
said electrode means including a pair of sheet-like electrodes mounted on said circumferential outer surface of said chamber, each of said pair of electrodes having a peripheral edge confrontingly spaced from a peripheral edge of the other electrode such that a substantially uniform gap is defined between confronting edges of said pair of electrodes fully along the confronting edges;
said peripheral edge of at least one of said pair of electrodes having a plurality of projections formed thereon and the peripheral edge of the other of said pair of electrodes having a plurality of recesses defined therein for receiving the projections formed on the peripheral edge of said one electrode; and
one of said pair of electrodes being connected to a high-frequency power supply, and the other of said pair of electrodes being connected to ground and having a lower end surrounding said chamber below said one of said pair of sheet-like electrodes.

21. A plasma processing apparatus according to claim 20, wherein said first and second sheet-like electrodes as mounted on said chamber are slightly spaced from said outer circumferential surface of said chamber.

22. A plasma processing apparatus according to claim 20, wherein said chamber comprises a coaxial-type tubular chamber including a tubular conductive member disposed within the outer circumferential surface of said chamber coaxial with said longitudinal axis, the workpiece is disposed in a space within said tubular conductive member, the tubular conductive member has openings defined in a circumferential surface thereof such that the tubular conductive member prevents charged particles produced relative to the generation of a plasma between the first and second sheet-like electrodes from entering said space.

* * * * *

UNITED STATES PATENT AND TRADEMARK OFFICE
CERTIFICATE OF CORRECTION

PATENT NO. : 5,435,880
DATED : 25 July 1995
INVENTOR(S) : Mitsuaki Minato, Atsushi Matsushita, Shinichi Omori, Jun Kanamori It is certified that error appears in the above-indentified patent and that said Letters Patent is hereby corrected as shown below:

Column 1, line 18, change "bell-Jar" to --bell-jar--.

Column 3, line 21, change "44" to --4-4--.

Column 5, line 30, change "forth" to --fourth--;
        line 31, change "FIGS" to --FIGS.--;
        line 54, change "forth" to --fourth--.

Column 6, line 22, before "chamber" insert --a--.

Signed and Sealed this

Fifth Day of December, 1995

Attest:

BRUCE LEHMAN

Attesting Officer

Commissioner of Patents and Trademarks